United States Patent
Smith

(10) Patent No.: US 8,577,430 B1
(45) Date of Patent: *Nov. 5, 2013

(54) NUMBER RESOLVING SUPERCONDUCTING NANOWIRE PHOTON DETECTOR ON MULTIPLE SURFACES OF A SUBSTRATE

(75) Inventor: Amos Matthew Smith, Rome, NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 21 days.

This patent is subject to a terminal disclaimer.

(21) Appl. No.: 13/507,582

(22) Filed: Jul. 5, 2012

(51) Int. Cl.
*G01F 23/24* (2006.01)

(52) U.S. Cl.
USPC .......................................... 505/160

(58) Field of Classification Search
USPC ...................... 505/160; 250/214 R; 977/954
See application file for complete search history.

(56) References Cited

U.S. PATENT DOCUMENTS

| | | | |
|---|---|---|---|
| 2009/0050790 A1* | 2/2009 | Dauler et al. | 250/214 R |
| 2010/0123120 A1* | 5/2010 | Mohseni | 257/21 |
| 2013/0172195 A1* | 7/2013 | Bellei et al. | 505/160 |
| 2013/0187051 A1* | 7/2013 | McCaughan et al. | 250/340 |

\* cited by examiner

*Primary Examiner* — Colleen Dunn
(74) *Attorney, Agent, or Firm* — Joseph A. Mancini

(57) ABSTRACT

A superconducting nanowire photon detector apparatus comprising detection, insulating, and substrate layers. The insulating layer provides electrical isolation of a plurality of individual detector elements from the interconnection network fabricated on the substrate layer except where electrical interconnection between the inputs and outputs of each detector element and the interconnection network is intended.

13 Claims, 8 Drawing Sheets

NUMBER RESOLVING SUPERCONDUCTING NANOWIRE PHOTON DETECTOR ON MULTIPLE SURFACES OF A SUBSTRATE

STATEMENT OF GOVERNMENT INTEREST

The invention described herein may be manufactured and used by or for the Government for governmental purposes without the payment of any royalty thereon.

BACKGROUND OF THE INVENTION

The ability of a, very thin and very narrow, section or "nanowire" of superconducting material to detect the impact of a photon has long been known. The basic principle is as follows. A nanowire of a superconducting material is created and electrically wired to a voltage source. As the current flows through the wire it creates heat. If the cooling needed to reach the temperature for superconducting phenomena ($T_C$ of approximately 10 kelvin or less) and the heating due to the current density in the nanowire are properly balanced, then the nanowire can be held extremely close to, but under, the superconducting phase transition. Below this critical temperature, $T_C$, the wire effectively has no resistance. Just above the critical temperature the wire is not superconducting and has a finite resistance. When a photon strikes the superconducting nanowire it breaks the cooper pairs in the vicinity and creates a hot spot. If this photon induced hotspot raises the temperature of the segment of nanowire above $T_C$ then the hotspot will undergo a phase transition and no longer be superconducting. If the non-superconducting area is large enough, or equivalently the nanowire is small enough, it will block the entire nanowire. This leads to a sudden rise in the resistance of the nanowire. This change in resistance can be detected by various electronic setups and a single photon is counted. Once the hot spot from the incident photon disperses, the wire will return to the superconducting state and the device will be ready to detect another photon. This is called the reset time of the device.

Traditional Superconducting Nanowire Single Photon Detectors (SNSPDs) are made from one long nanowire. In order for this single nanowire to cover a useful area a "meander" is created. In effect the wire is folded back and forth across the surface of the desired area, usually about 10 μm by 10 μm (microns). These devices are called "single photon detectors" because the nanowire can only feel the loss of the superconducting condition somewhere along its length. If two photons hit the nanowire at the same time, two hot spots are created but only the increase in resistance is felt so the detector can "see" only one photon. Such detectors are effectively high pass filters; they can detect the presence of 1 or more photons without being able to count them. Similarly the device has no means of measuring spatial resolution. The output signal of the device is not a function of the location of the photon impact.

A second drawback of the long nanowire approach is the relaxation time of the detector. It has been shown that the relaxation time, the time for a hot spot to dissipate, is related to the kinetic-inductance and thus the length of the nanowire. This leads to a relaxation time of about 10 ns for a niobium nitrite, NbN, single wire 10 μm by 10 μm meander. The operational repetition rate will need to be significantly slower than the relaxation time of the device to avoid interactions between the relaxation and incoming photons. This leads to experimental repetition rates much slower than current pulsed laser systems which are capable of gigahertz frequencies.

To create the number resolution of the overall optical device multiple nanowires detectors are needed. In U.S. Patent Application Publication No. 2009/0050790A1 by Dauler et al., one possible method to gain some amount of number resolution is given, the so called multi element superconducting nanowire single photon detector (MESNSPD). Their method involves interleaving multiple long nanowires in a parallel meander across the surface of a substrate chip. While this solution is somewhat effective in creating number resolution, it has numerous drawbacks common to all current SNSPDs and the limited number of nanowires available, currently 10 or so, limits the number resolution of the device.

One of the most important effects in a SNSPD is that of current crowding. Current crowding in superconducting nanowires has been studied by Clem and Berggren. The heating in the superconducting nanowire, as mentioned above, is vital and is determined by the local current density along the wire. Ergo an area with higher current density will be "hotter" than an area of low current density. In order to maintain the necessary superconducting condition along the full length of the wire the maximum bias current applied through any nanowire detector is determined by the point of highest current density and therefore highest temperature. Current crowding as discussed by Clem and Breggen describes the effect of bends and constrictions in the nanowire which increase the local current density, such as the bends in the multi element superconducting nanowire single photon detector (MESNSPD) of Dauler et al. and standard SNSPDs. These bends are then the hottest spots on the detector, i.e. the closest to the critical temperature $T_C$. This is a significant problem as the quantum efficiency of any region of a nanowire is proportional to how close that nanowire region is to $T_C$. The incident single photon carries a very small amount of energy and creates a small amount of heating. The closer the operating temperature, sometimes called bias temperature $T_B$, is to the $T_C$ the higher the efficiency of that region of nanowire is. The quantum efficiency of the device can then be thought of as the average efficiency of all the segments of the wire. If one segment is higher in temperature, such as the bends in a current SNSPD or MESNSPD, then ALL of the rest of the wire will have a lower efficiency. We also note that the high efficiency corners are often left out of what is considered the "active" area of many devices.

It should also be noted that in all current SNSPDs or MESNSPDs the current crowding effect limits the fill factor. Fill factor is the ratio of the active area that can detect a photon to that which can't, i.e. the ratio of the nanowire area to substrate area within the active detection area. Yang et. al teach in their article "Suppressed Critical Currents in Superconducting Nanowire Single-Photon Detectors with High Fill-Factors" that, as the name implies, large fill factor detectors have lower efficiency. This is a counterintuitive result as one would expect that the more photon sensitive area there was within the active area the higher the efficiency would be. In the work of Clem and Breggen it is noted that the sharper the bend in a nanowire the worse the effect of current crowding becomes. As the fill factors increase in all single layer SNSPDs and MESNSPDs the bends approach the worst case of sudden 180 degree turns. This limits the fill factor of any traditional detector and thus reduces the total quantum efficiency.

Another drawback of SNSPDs that likewise persists in MESNSPDs are long reset times. The reset time of a SNSPD is directly proportional to the kinetic inductance of the nanowire and can be altered by altering the geometry of the nanowire, such as its thickness or width. For a given geometry, the kinetic inductance is directly proportional to the length of the nanowire. Thus the reset time can be adjusted by changing the length of the superconducting nanowire, that is shortening the wire will provide the benefit of a shorter reset time. This is a significant drawback to existing SNSPND and MESNSPD. Because they are based on long continuous wires the effect of reducing the length of the wire is to reduce the size of the active area of the detector. Such a reduction in area is often unacceptable as the input photons are difficult to focus on a small area. In the MESNSPD this can be countered to a degree by adding more wires into the meander pattern, thus spreading it back outward, but even here the nanowires remain tens of microns long.

One definition of an ideal number resolving photon counter would be an analog of modern Charged Coupled Device (CCD) cameras. In that example, it is desired to have a large two dimensional array of pixels that covers the active area with the maximum number of small pixels, which are placed as compactly as physically possible. This would lead to being able to resolve large numbers of photons (from the large number of pixels) while having the shortest practical reset time and good spatial resolution (both from the small pixels), and the highest fill factor (from the closely packed pixels).

A final comment that must be mentioned with regard to the prior art is the lack of spatial resolution. The SNSPDs and MESNSPDs discussed above have little to no spatial resolution because each nanowire crosses the full, or at least a significant percent of in the case of non interleaved MESNSPDs, active area of the device.

What is needed therefore and has to date not been provided by the prior art is a superconducting nanowire photon detector that allows for improvements across a wide area of device characteristics, such as a reset time, fill factor, high quantum efficiency, spatial resolution and most importantly highly efficient resolution of the number of incident photons (number counting). This is needed as many experiments and applications in quantum optics require number resolution to be able to produce the correct results. The recently developed MLSNPD of Smith (U.S. patent application Ser. No. 13/506, 857) addresses and improves upon many of these areas through the use of a novel Multi-layer architecture that placed the interconnected leads and detection elements on different layers of the device that were insulated against cross talk. While this more complicated architecture is effective it is desirable to simplify such a design.

OBJECTS AND SUMMARY OF THE INVENTION

We therefore provide a significant modification of the design paradigm of the MLSNPD that maintains the superior features of the MLSNPD while simplifying its fabrication.

Briefly stated, the present invention provides a superconducting nanowire photon detector apparatus comprised of a single substrate wafer (also called the chip) onto which are fabricated both the leads and the detection elements. Rather than placing the leads and detection elements on the same surface, such as in the MESNSPD, or building multiple stacked layers on one surface of the substrate wafer, such as in the MLSNPD, we place the leads on one surface of the substrate chip and the detection elements on the opposite surface of the chip. Electrical connections are made by effectively drilling holes (or "vias") completely through the substrate, at chosen points, and then filling said vias with conducting or superconducting material. The substrate itself then acts as the insulating layer in the MLSNPD design paradigm.

In a preferred embodiment of the present invention, a superconducting nanowire photon detector apparatus comprises a substrate layer having an interconnection means fabricated on one surface; and a detection layer fabricated on another surface, where the detection layer comprising a plurality of detector elements being fabricated thereon, and each of the detector elements have an input and an output. In the preferred embodiment, the substrate comprises the insulating layer; the lead layer comprises the interconnection means on one surface; and the detection layer comprises the detection elements on the opposite surface. The substrate is situated so as to insulate the interconnection means from the detection layer. The interconnection means facilitates routing signals input into the apparatus to the inputs of each of the plurality of detector elements and routing signals output from each of said plurality of detector elements out of the apparatus. The substrate has means for each of the inputs and outputs of each of the detector elements to make electrical contact with corresponding portions of the interconnection means.

The present invention may embody a single prefabricated substrate waver onto which electrical elements have been fabricated onto opposite surfaces. These surfaces will be referred to as the top or detection layer and the bottom or lead layer in analogy to MLSNPD. Similar to the MLSNPD the architecture of the present invention is based on the desirable goal of separating the leads and detector elements onto different surfaces while maintaining the necessary electrical connections. It is then possible to "pixelate" the detector. What is meant is that the present invention is able to create a full two-dimensional array of short sections of nanowires. These are called pixels or "pixel bridges" because of their suggestive shape as shown in FIG. 1. Other designs for the pixel shape and arrangement are possible within the scope of the present invention.

Unlike the MLSNPD the fundamental substrate of the device plays an important role in the design and properties of the present invention. The first stage of the fabrication procedure will be to create vias through the substrate and to fill them with the chosen material, be it conducting or superconducting. As mentioned above the reset time of the devices is strongly influenced by the length of the superconducting pixel bridge. Therefore the thickness of the substrate becomes an important factor, both from the point of controlling the reset time and from the need to have a uniform thickness. Most commercially available substrate wavers such as R-plan sapphire are far too thick to be used in their current form, or the order of millimeters thick. Therefore it is necessary to "thin" the wafer. This can be done by custom fabrication of thin wafers or by etching and chemical and mechanical planarization of thick wafers. There is an inherent drawback to the use of large thin wavers and that is their fragility. Therefore while it is possible to create and use thin wafers, as it is possible to use thick wavers, the preferred embodiment of the invention will use a wafer in which a small area has been thinned to a preselected thickness. This area will contain the pixel bridges similar to the MLSNPD, while maintaining most of the strength of the original thick wafer. A cross section of the substrate is seen in FIG. 7, showing the thick wafer and the section which has been thinned to the desired amount.

Onto one surface of the prepared (i.e. vias drilled and filled) chip will be fabricated the interconnection means that constitute the Lead layer. This includes, but is not limited to, the leads themselves and the contact pads which are needed to solder wires to the device. Items such as the contact pads are industry standards and will not be discussed in detail. The lead layer could be applied to either surface of FIG. 7, However do to the large size of some components in the lead layer, such as the contact pad which are on the order of 100 um square, it is easier to place the lead layer on the flat surface of the chip. The thin spot could be made large enough to encompass the lead layer or vertical lead could be fabricated out of the thin spot, but as large thin areas are fragile this is not a preferred configuration.

On the opposite surface, within the thinned spot the detection layer will be fabricated. This layer consists of a thin film of superconducting material that is then patterned into the desired pixel shape; this example is depicted in FIG. 6. This layer is approximately only 4-10 nanometers thick depending on the superconducting material used. These small nanowires are the same as that used in current state of the art detectors and will have identical properties.

The first and greatest advantage of the present invention's architecture is the highly efficient number resolving capability that is critical to many applications. The number resolving capability of a pixilated detector, similar to the MLSNPD, can always be made larger than that of an equivalent MESNSPD that uses a single layer meander regardless of the number of nanowires it contains. This is accomplished by taking the meander pattern and separating each leg of the meander into its own pixel regardless of the initial pattern, the MESNSPD pattern need not be the standard square meander nor do the pixel all need to be the same shape or size. The number resolving efficiency can be raised even higher by shortening and adding more pixels.

There is a minimum length of superconducting nanowire that can be used as a photon detector in any configuration. This is due to the latching condition described by Kerman et al. (Applied Phys. Lett. 88, 111116 (2008)). If the kinetic inductance of the nanowire becomes too small (equivalent to saying the wire is too short) then the nanowire will fail to return to the superconducting state after detecting a photon. This effect is created because the electric heating due to current passing through the hot spot is equal or greater than the cooling being done to the system. This is an unsurpassable physical lower limit to single layer designs, but it is not so great a problem as the lower limit tends to be much smaller than the length of nanowire needed to create a useful meander area.

Small pixels, even pixels smaller than this latching limit can be created with our two surface MLSNPD design. It is noted that the length of the nanowire is not the same as the length of the nanowire in the active area of a pixel. FIG. 1 depicts a pixel bridge. The length of that nanowire, which determines the kinetic inductance, is the length of the active area on the detection level and the length of the two posts imbedded in the wafer. Thus the pixel bridge of the present invention is larger than the pixel. While there is a minimum limit to the thickness of the substrate there is no theoretical maximum limit. Therefore, the nanowire used to make the pixel can be arbitrarily long (i.e. arbitrarily thick wafer) without changing the pattern of the pixels on the detection layer. This allows the present invention, similar to the MLSNPD, to completely overcome this limit and to optimize the reset time during the device fabrication, where a single layer device cannot. Also current detectors seek to reduce the kinetic inductance of their device by choosing materials that have low kinetic inductance per unit length. A detector with small pixels may benefit from using a superconducting material with a higher kinetic inductance per unit length. This could reduce the need for extremely thick insulating layers. These features give the present invention a clear advantage over all existing single layer devises, SNSPDs and MESNSPDs, in the crucial areas of number resolution and reset time.

By creating a regular pattern of a large number of pixels on the detection layer, the present invention gains significant though not total information about the spatial distribution of the incoming stream of photons. Initial devices may have too few elements, 10 to 20, to produce actual pictures. As fabrication methods improve reliability the number of elements can be increased significantly to the point of taking real images of nano-scale phenomenon by integrating over time or multiple repetitions of the events. This would effectively be a low light superconducting nanowire CCD camera. Such information could be used for low intensity applications of spectroscopy among others.

In the work by Kerman et al. constrictions are sighted as a possible cause of reduced quantum efficiencies due to current crowding. As stated above, the constrictions, such as bends in the nanowire, are the point's closest to the critical temperature and therefore the most sensitive to a photon impact. The majority of SNSPDs and MESNSPDs are not constricted, i.e. straight sections of wire, and therefore have lower average current densities and quantum efficiencies.

The single layer SNSPDs have a significant drawback that the constrictions increase as the fill factor of the meander pattern increases. This increased constrictions lead to increased current crowding at the bend and lower efficiency in the straight sections. This thwarts the purpose of increasing the fill factor, the desire for higher efficiency. As the present invention pixels have no bends on the surface of the detection level they are not limited in this manner. Therefore our present invention can have larger fill factor. The only limit on the fill factor for our device is the unavoidable physical limit for avoiding cross talk and current leakage between pixels and is currently significantly higher than that achieved in effective SNSPDs. This effect is less significant in MESNSPDs but still plays a role.

Referring to FIG. 1, specifically the pixel bridge, it is clear that the area of greatest constriction and highest efficiency is the active detector layer 10, i.e. the road bed of the bridge, and there are no bends on the detector layer. The area of highest current crowding is right where it is wanted in the active detector area 10. Therefore the present invention's pixel will average higher quantum efficiencies than other similar detectors because current crowding is less of a problem, it is even an advantage.

DETAILED DESCRIPTION OF THE PREFERRED EMBODIMENT

Figure 1:
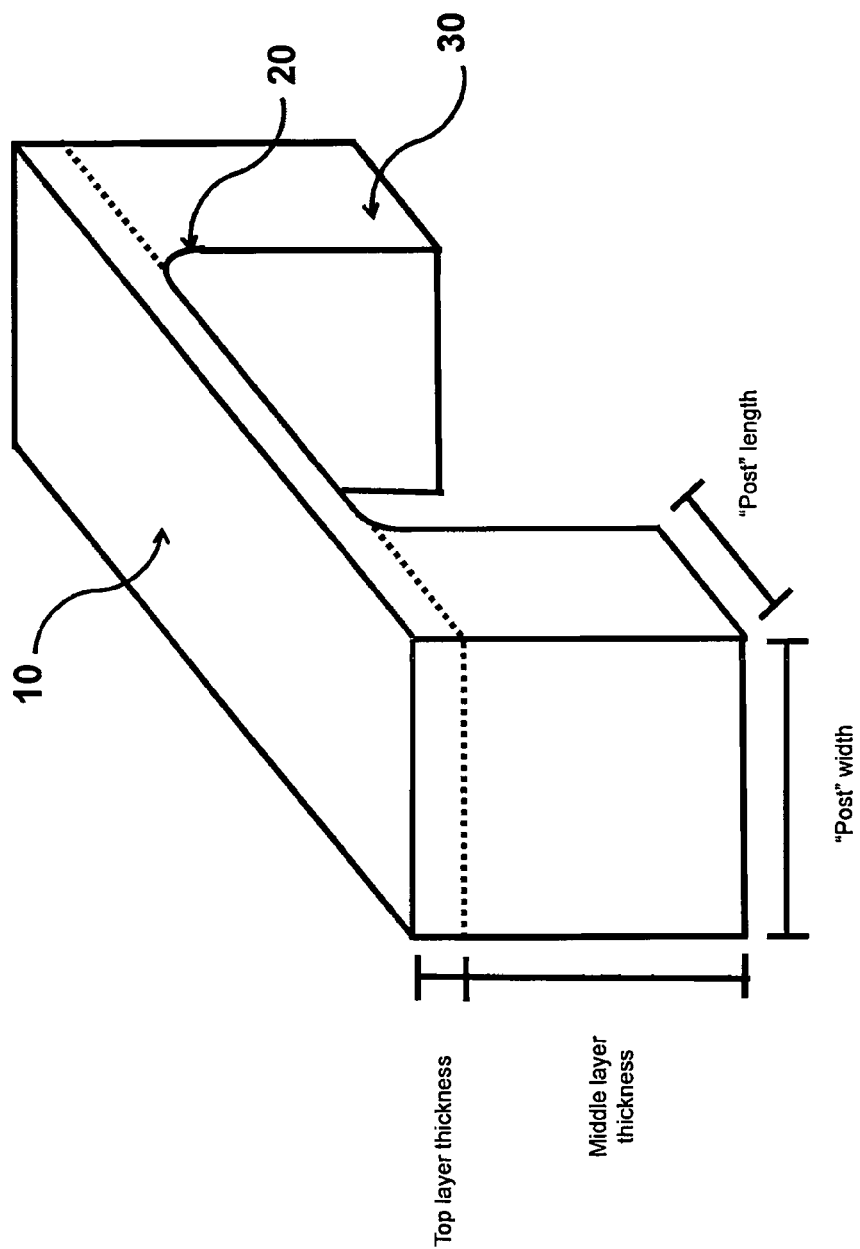
FIG. 1 depicts a single pixel or "pixel bridge" structure, constructed from superconducting material such as NbN. The "road bed" of the bridge is the active detection area on the detection layer; the posts connect the active detection area elements to the lead layer by penetrating the thin spot of the substrate wafer. We note the post need not be superconducting as long as the pixel is still long enough to avoid the latching condition.
Figure 2:
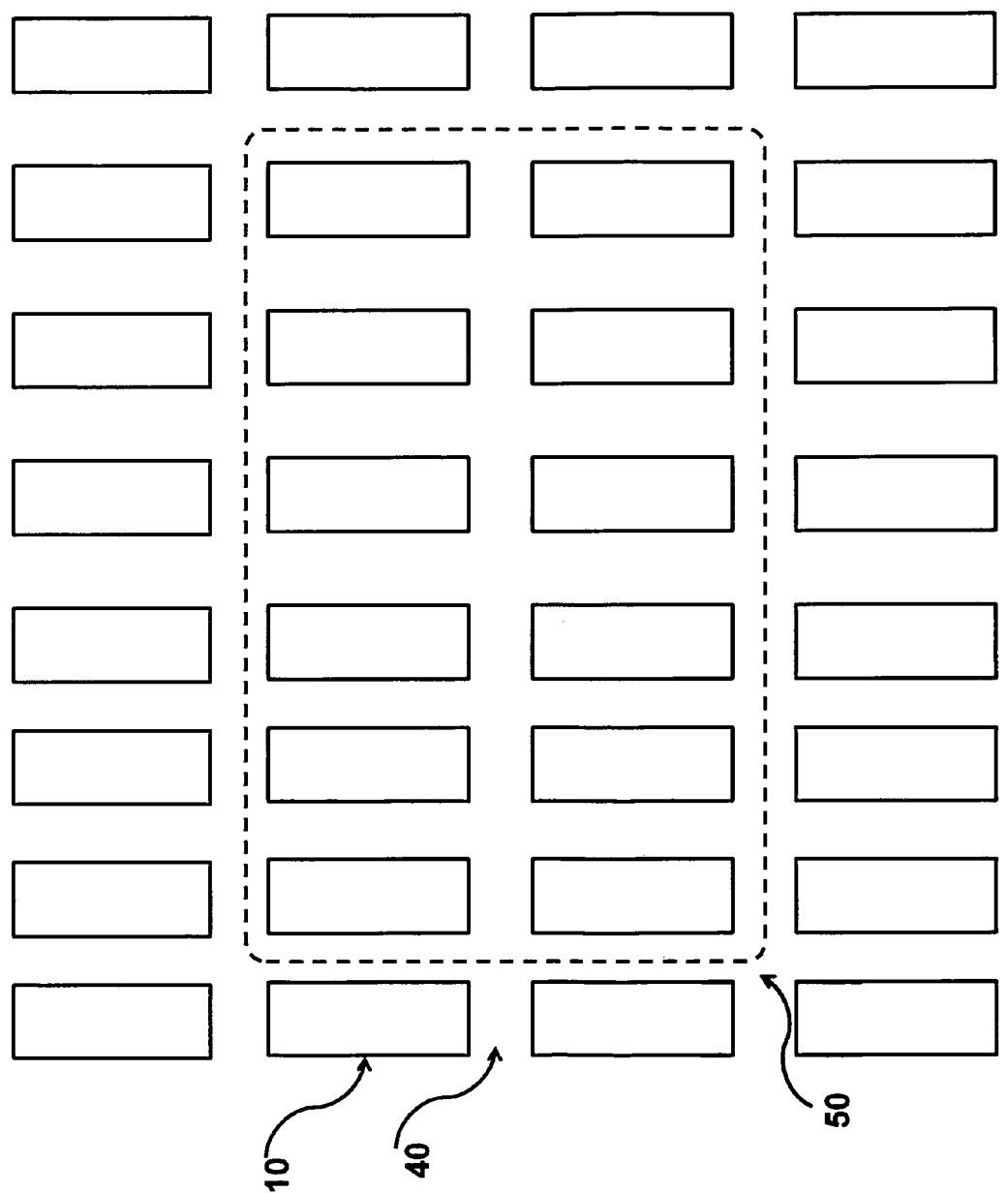
FIG. 2 depicts a plan view schematic diagram representing a two-dimensional array of 32 pixels. Each rectangle is an independent superconducting nanowire detector element (Pixel Bridge). The central pixels in the dashed box are those that a single layer architecture cannot connect leads to, while maintaining a useful fill factor.

Referring to FIG. 1, the fundamental element is a bridge shaped construction of a superconducting nanowire. A plurality of detector elements 10 will form what is called the detection layer (as depicted in FIG. 2). Vertical connections or "posts" 30 connect ends of the detector elements 10 to the lead layer via passage ways through wafer. Detector elements 10 and vertical connections 30 form a "bridge" and define the bridge's length and height. The length of the bridge and the height of the bridge can be stretched arbitrarily. The thickness of the detector elements 10, or similarly, the thickness of the detection layer, is highly dependent on physical properties of the superconducting material used in the device. The minimum length of the detector elements 10 and height of the vertical connections 30 of the "bridge" are determined by the same physical properties of the superconducting material as well as the properties of the substrate material, the desired size of the detection area and the overall layout of the pixel design. The interface of the detection element 10 and the vertical connection 30 will depend on fabrication procedures and may affect the overall efficiency through "current crowding". FIG. 1 depicts an idealized curved interface 20 between the detector element 10 and the vertical connection 30 which serves the purpose of reducing the current crowding. The minimum thickness of the device will depend on the superconducting material used, the latching length L, the desired size of the pixel on the detection layer D and the pixel and post geometry. The preferred thickness T of the thinned section of the substrate will be chosen such that the length pixel bridge is just longer than half the latching length L, such that $T \geq (L-D)/2$. We use greater than or equal to, in order to indicate that the thickness T should make the pixel bridge larger than the latching length. That said the shorter the bridge the faster the rest time. Thus the preferred implementation has T only slightly larger than $(L-D)/2$. We note that the superconducting material used and geometry of the nanowire, both in 10 and 30, will significantly affect the kinetic inductance and thus L and T. Because of this we note that the scaling of this image will not be constant between all MLSNPDs, therefore all subsequent figures are not to scale.

FIG. 2 shows an idealized plan view schematic of a two dimensional array of detector element "pixels" 10 on the detection layer. The dashed box 50 identifies the internal pixels which cannot be reached by leads without causing a loss in the fill factor, i.e. increasing non-detecting space between the pixels 40. This is due to the simple fact that the size of the leads is on the same order of magnitude as the pixels. In the preferred implementation the entirety of FIG. 2 will sit in the thinned section of the device.

Figure 3:
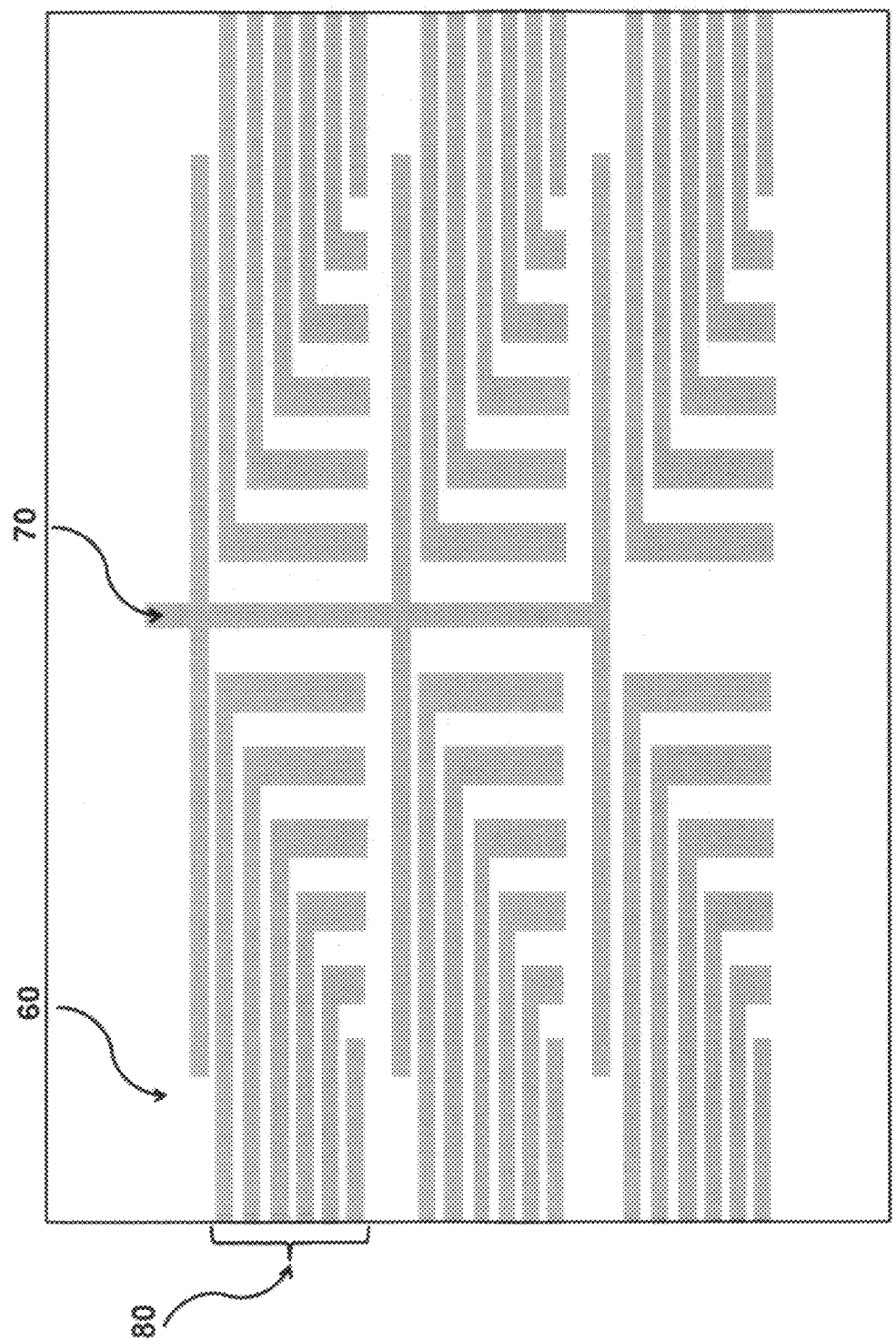
FIG. 3 depicts a plan view schematic of the lead layer showing one possible pattern of leads placed on a substrate having inputs and outputs, the contact pads are not shown due to scaling and because they are industry standards. Note that there is no complete circuit shown on this level, this forces the current through the posts to the other side (detection layer) of the wafer. In this design the leads layer is fabricated on the flat side of the wafer.
Figure 7:
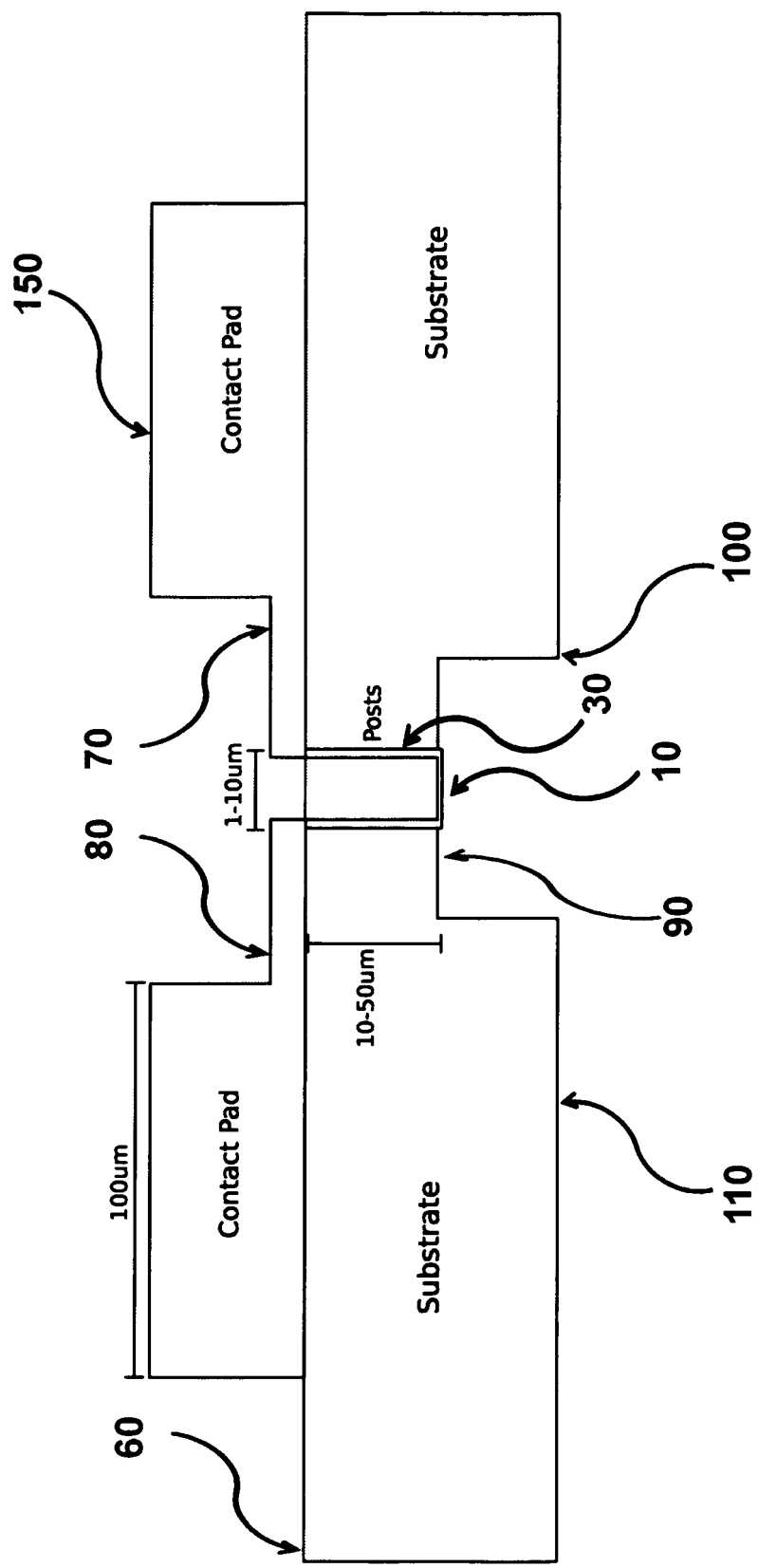
FIG. 7 depicts a cross section of the full device showing the thick substrate chip, the thinned section of the chip, the detection layer; consisting of the pixel bridge, the lead layer; consisting of interconnected means and contact pads. Approximate measurements are estimated from existing public literature. Here the edge of the thin section is shown a sharp edge; however it may in practice be a smoother transition from thick to thin areas. This has no detrimental effect on the operation of the device.

FIG. 3 depicts the "lead" layer of the invention. Input leads 70 and the set of all output leads 80 are fabricated onto the "flat" side of the substrate 60. The choice of substrate will likely be determined by fabrication methods and the superconducting material used. As such, the choice of substrate material is not specified here and does not affect the scope of the invention. Input leads 70 and output leads 80 are patterned in conductive, but not superconducting material, such as copper. Note there is no electrical connection between the input leads 70 and output leads 80 on this layer. The input leads 70 and output leads 80 are shown in a parallel configuration of pixels. These leads may equivalently be separate circuits, series circuits, blocks of parallel and or series circuits, or other simple arrangements with correspondingly different detection electronics, without affecting the fundamental invention. Both the input and output leads 70 and 80 continue beyond their shown extent and connect to contact pads (FIG. 7, 150). As these elements are industry standard, they are not shown.

Figure 4:
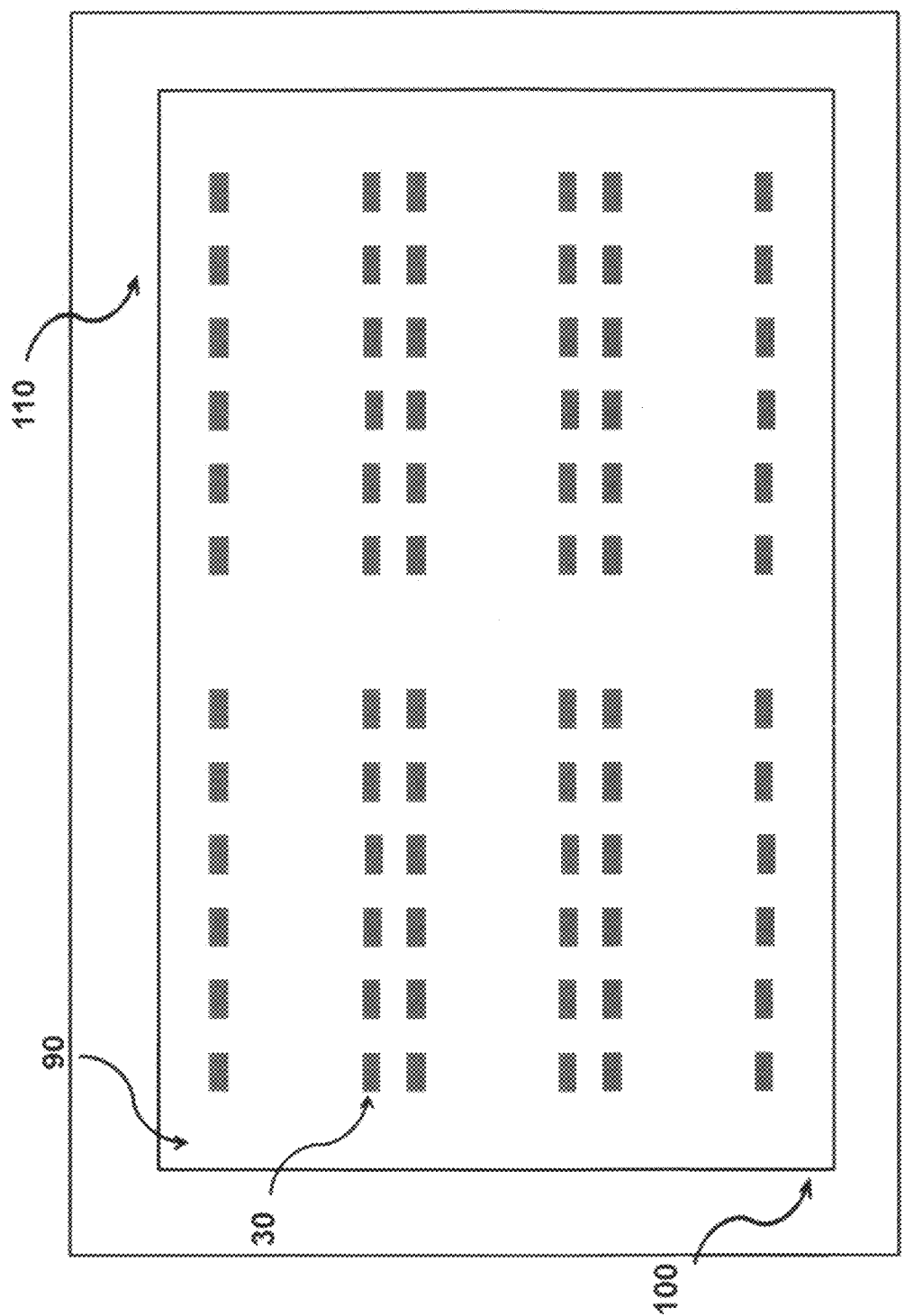
FIG. 4 depicts a top down view of the substrate, including the vias which are drilled at predetermined points and filled, in this case with superconducting material. The thinned section of the substrate wafer is shown as box around the vias, indicating a vertical cut into the wafer. As the only purpose of the thick section of the substrate is to provide structural support for the thinned section it is shown (here and in subsequent figures) as a narrow border, but may extend orders of magnitude further out.

Referring to FIG. 4, the thinned section of the substrate 90 consists of a substrate material into which "vias", i.e. passage ways, provide for the vertical connection "posts" 30 to pass between the detector elements 10 and the leads 70, 80. These "posts" 30 penetrate the substrate material 90 and when properly patterned will connect the leads 70, 80 in the lead layer and the detector element 10 in the detection layer. This configuration thus forms the desired plurality of pixels on the detection layer. We note that for some configurations, particularly meander arrays and other long pixels shapes that the posts need not be superconducting material and may be the same or similar material as the leads, i.e. copper.

Still referring to FIG. 4, the thin section of the chip 90 is bounded by the inner square box 100, the thin section 90 need not be square nor have vertical edges and may be any shape and slope. The shape and slope may be determined by the fabrication method of the thinned area. Outside of this box 110 is the thick section of the substrate wafer. It is shown as a narrow border as its purpose is only to provide structural strength to the thin section of the wafer 90. In practice the wafer 110 will continue for orders or magnitude in both directions, as this does not materially affect the design this extent is omitted from all figures.

Figure 5:
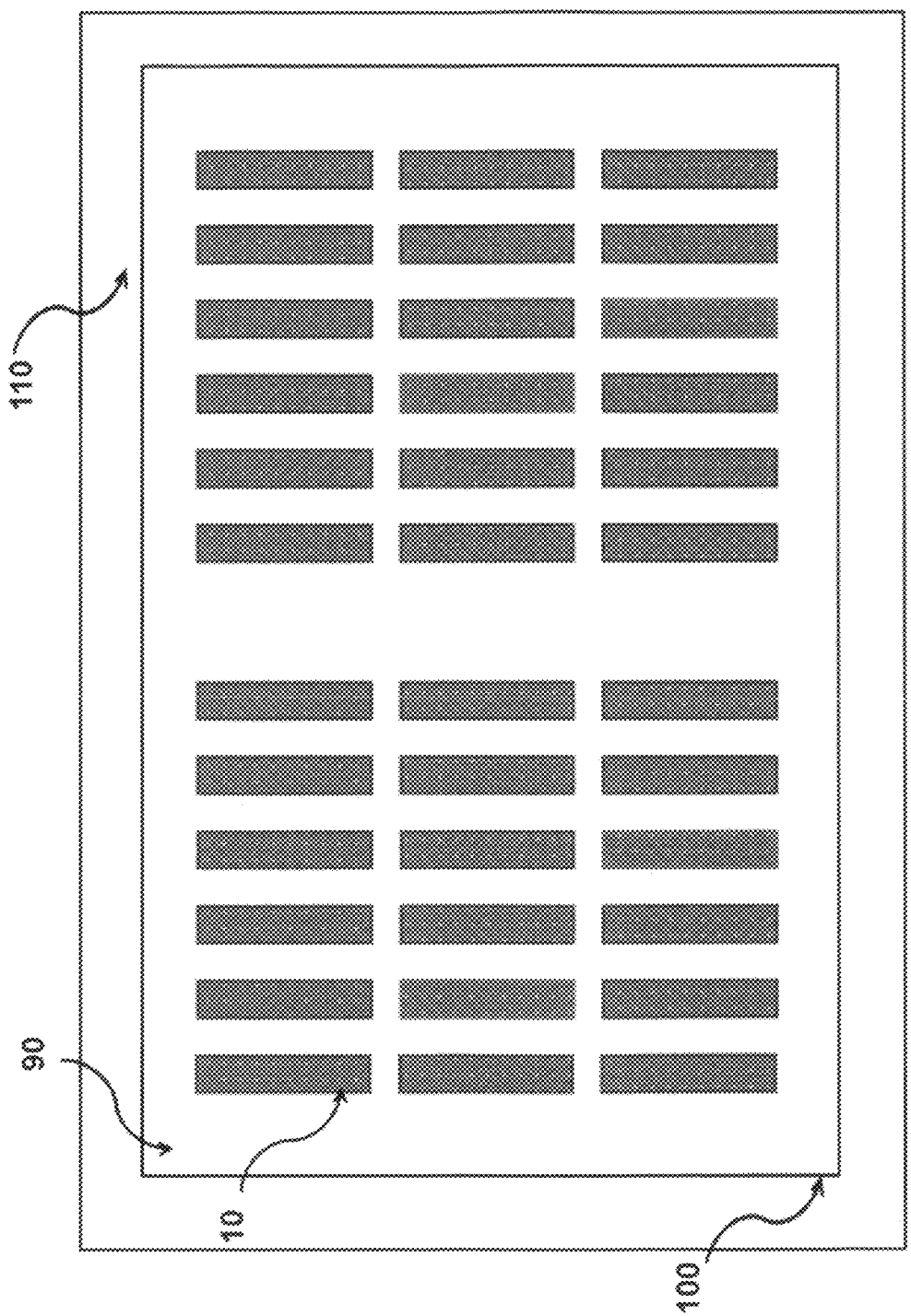
FIG. 5 depicts a top down schematic showing an example of 36 superconducting nanowire pixels in the detection layer, fabricated in the thin spot of the substrate.

Referring to FIG. 5, the detection layer consists of a pattern of superconducting detector elements 10. These detector elements are placed such that they overlap the posts (see FIG. 4, 30) in the thinned area of the substrate and thus complete the circuit through the device. The pixels are patterned directly on the top surface of the thinned section of the substrate 90. Different fabrication procedures may necessitate an insulating embedding material but this does not alter the behavior of the device.

Figure 6:
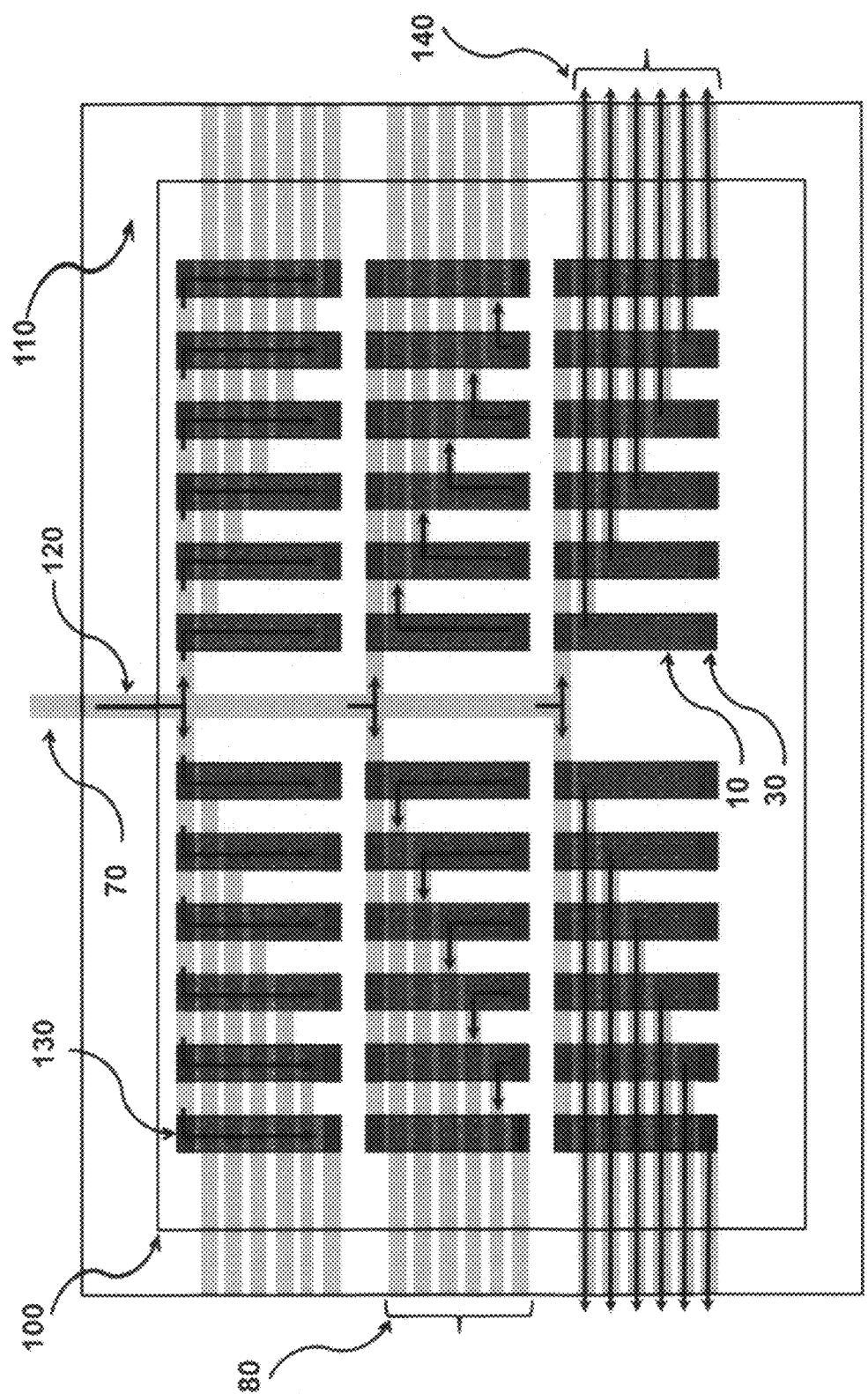
FIG. 6 depicts a composite of FIG. 4, FIG. 5 and FIG. 6 so as to show a top down schematic of the stacked detection layer, substrate, and lead layer of the present invention.

Referring to FIG. 6, we show a see through plan view of the full device. The arrows indicate the direction of current flow though the device. The input current 120 enters in an input lead 70 the lead layer (bottom side in this view, see FIG. 3) at the top center of this example. Once divided among the pixels 10, the current is called the Bias current 130. The Bias Current required is determined by numerous factors such as the superconducting material used, the geometry of the pixels, fabrication defects, among others. The Bias current passes through the substrate via the posts 30. The bias current then moves along the detector element nanowires 10 similarly to single layer designs, but then returns to the lead layer in order to exit the device through output leads 80 as output current depicted by the arrows 140.

FIG. 7 depicts a cross section of the device showing the various components; the thick substrate 110 and its thinned area 90, which is penetrated by the posts 30. On the opposite (flat) side 60 is the lead layer; consisting of interconnected means 70 & 80 and the contact pads 150. Again we note that dimensions of the device are estimated, not to scale and not unique; such as the thickness of the thinned area 90 (10-50 um), or relative thicknesses between the full substrate wafer 110 and the thinned area 90. Also shown are two of the posts 30 and two contact pads 150 and the boundary between the thin and thick areas of the substrate 100. Current will enter at one contact pad 150 and move across the input lead 70. The current will move to the other side of the substrate in the posts 30 to reach the detection layer 10. In 10 and 30 the current is called a bias current (see FIG. 6, 130) and the superconducting nanowire in this layer will be able to detect incident photons. Then the current will move back to the output lead 80 through the post 30, out to another contact pad and off the chip. Note that nothing in the design paradigm must move from the thick substrate 110 over the boundary 100 to the thin spot 90. Thus the geometry of this transition does not directly affect the function of the device. Creating a lead or other structure that did move from 110 to 90, while not infeasible would be difficult and would require detailed knowledge of the shape of 100. Thus we use the flat side of the substrate 60 for the largest features 70, 80 & 150.

Figure 8:
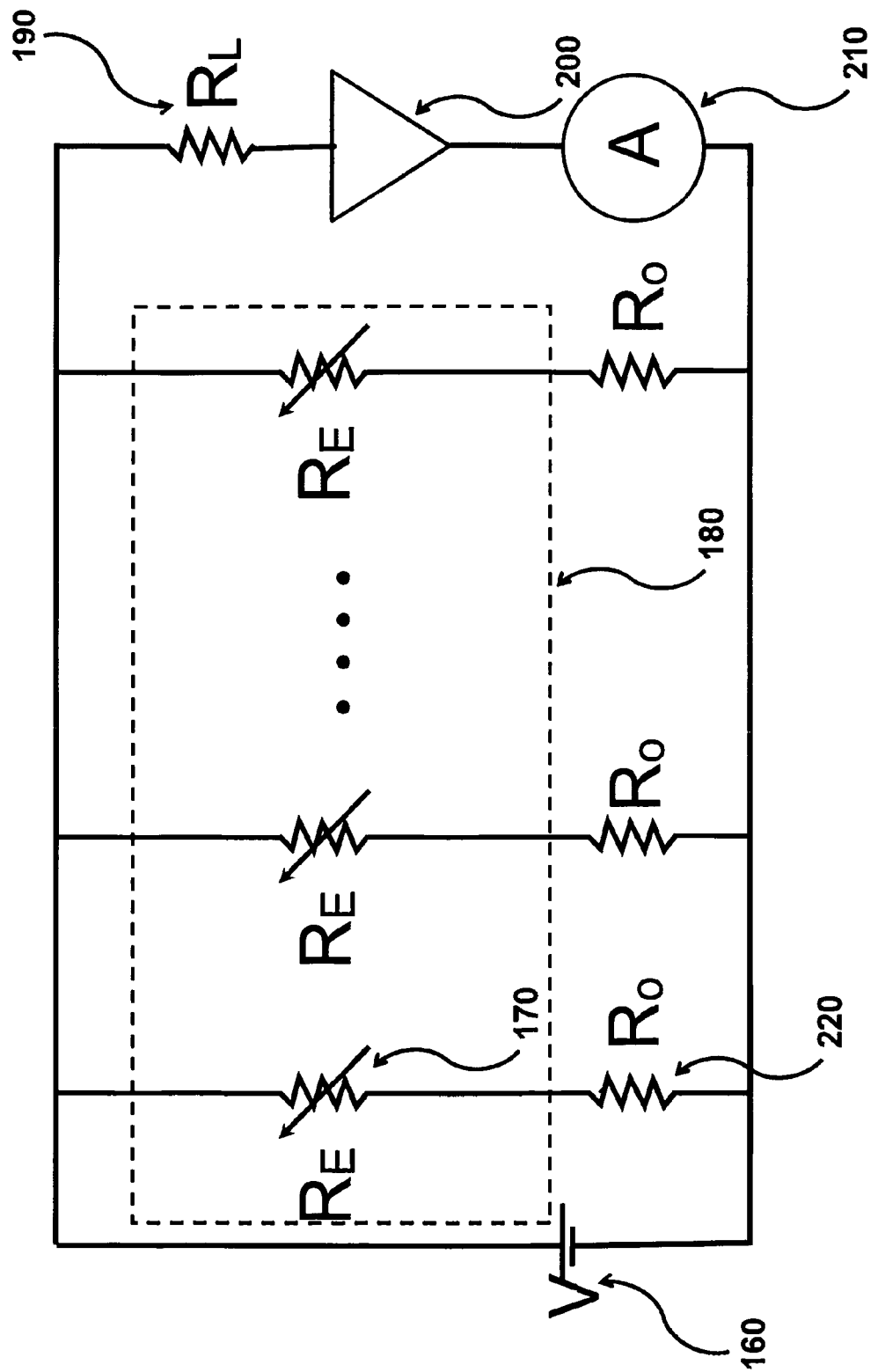
FIG. 8 depicts a circuit diagram of the detector and the off chip electric elements used for detecting the photon response.

FIG. 8 depicts an equivalent circuit diagram of the device including the off chip, i.e. not super-cooled, electronics. The voltage source is any DC source 160, of either variable or a preselected voltage to create the desired bias current for a given device. The superconducting nanowire detector elements (pixels) are indicated by variable resistors $R_E$ 170. When a photon impacts a pixel the resistance of that element rises significantly for a short time (it could also be considered a type of light dependent resistor). This diverts some fraction of the bias current from that element into the other possible paths. This includes both the other elements and the measurement electronics 190, 200 and 210. The dashed box 180 indicates the minimum part of the circuit, containing the pixels that must be super-cooled. The off-chip detection electronics consists of a resistance load $R_L$ 190, and an ammeter, or similarly a galvanometer or oscilloscope 210 depending on the required sensitivity for a given device or application, and optionally, a signal amplifier 200. Here we note that the intrinsic resistance of 200 and or 210 may take the part of $R_L$ 190, The resistors $R_O$ 220 and $R_L$ 190 are chosen so as to maximize the fraction of the diverted current that enters the measurement apparatus. $R_O$ 220 may or may not be on the super cooled chip. The ratios of the resistors $R_O$ 220, $R_L$ 190 and $R_E$ 170 will determine factors such as the signal to noise ratio. $R_O$ 220 and $R_L$ 190 can be controlled arbitrarily but $R_E$ 170 is the resistance of the hot spot and will be fixed by the superconducting nanowire material and the geometry of the nanowire and number of the pixels. This leads to optimal values of $R_O$ 220 and $R_L$ 190 that differ for every pixel number and material, similarly to the MLSNPD. As a rule of thumb we state that for any system the resistance should behave roughly as $R_E \gg R_O \geq R_L$ (170, 220 & 190). We note here that the details of the off chip electronics are no different than that of existing SNSPDs and MESNSPDs and that the contact pads on the lead layer that allow for the connection of the off chip wires to the on chip leads are not shown as they are industry standards.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A superconducting nanowire photon detector apparatus, comprising;
   at least one substrate wafer, said substrate layer comprising an interconnection means disposed thereon;
   at least one insulating layer; and
   at least one detection layer, said detection layer comprising a plurality of super conducting detector elements being disposed on said insulating layer, each of said detector elements having an input, an output, and a superconducting resistance characteristic;
   wherein said insulating layer is disposed between said substrate and said detection layer so as to insulate said interconnection means from said detection layer;
   wherein said interconnection means further comprises means for:
      routing signals input into said apparatus to the inputs of each of said plurality of detector elements; and
      routing signals output from each of said plurality of detector elements out of said apparatus; and
   wherein said insulating layer further comprises means for each of said inputs and outputs of each of said detector elements to make electrical contact with corresponding portions of said interconnection means.

2. Apparatus of claim 1 wherein said means for each of said inputs and outputs of each of said detector elements to make electrical contact further comprises:
   voids in said substrate coincident with the location of each of said inputs and outputs of each of said plurality of detector elements;
   wherein said voids penetrate the thickness of said insulating layer; and
   posts composed of superconducting material disposed therethrough each of said voids so as to electrically connect said inputs and said outputs of each of said detector elements to corresponding portions of said interconnection means.

3. Apparatus of claim 1 wherein said means for routing signals comprises meandering conductors.

4. Apparatus of claim 3 wherein said each of detector elements, and each of said posts connected to said input and said output of said detector elements, form a bridge structure under which conductors not intended to be electrically connected to, pass.

5. Apparatus of claim 4 wherein the interface formed at the connection of each said input and said output of said detector elements and said posts is radiused so as to prevent current crowding.

6. Apparatus of claim 4 wherein said means for routing signals supports the flow of a bias current into said apparatus, through each said bridge structure, and out of said apparatus.

7. The apparatus of claim 6, wherein said bias current creates heating in said detector element to just below said detector's critical temperature.

8. The apparatus of claim 7, wherein photon impacts upon said detector element cause:
- a rise in the resistance of said detector element; and
- a diversion of said bias current from said detector element to other current paths among said meandering conductors.

9. The apparatus of claim 8, wherein said interconnection means routes said diverted bias currents out of said apparatus into a measurement means comprising a load resistance and a measurement device.

10. The apparatus of claim 1 wherein said insulating layer is comprised of materials which
- retain insulating properties at super-cooled temperatures; and
- are transparent to a desired wavelength.

11. The apparatus of claim 1 wherein the thickness of said detection layer is in the range of approximately 4 to 10 nanometers.

12. The apparatus of claim 9 wherein said measurement means further comprises an amplifier.

13. The apparatus of claim 12 wherein the resistance of said detector element, bias resistance and said load resistance are chosen such that:

$$R_E \gg R_O \geq R_L$$

where $R_E$ is a resistance of the detector element at a given temperature;
$R_O$ is a bias resistance; and
$R_L$ is a load resistance.

* * * * *